US012812816B2

(12) United States Patent
Ortenzi et al.

(10) Patent No.: US 12,812,816 B2
(45) **Date of Patent: *Nov. 24, 2026**

(54) COOLING SERVERS WITH VELOCITY AUGMENTATION USING PARTIAL BY-PASS AIR RECIRCULATION IN RACK PLENUM

(71) Applicant: Dynamic Data Centers Solutions, Inc., St. Louis, MO (US)

(72) Inventors: Mark David Ortenzi, Escondido, CA (US); Chris Orlando, Escondido, CA (US)

(73) Assignee: Dynamic Data Centers Solutions, Inc., San Diego, CA (US)

( * ) Notice: Subject to any disclaimer, the term of this patent is extended or adjusted under 35 U.S.C. 154(b) by 143 days.

This patent is subject to a terminal disclaimer.

(21) Appl. No.: 18/809,092

(22) Filed: Aug. 19, 2024

(65) Prior Publication Data

US 2025/0056768 A1 Feb. 13, 2025

Related U.S. Application Data

(63) Continuation of application No. 17/648,174, filed on Jan. 17, 2022, now Pat. No. 12,069,839.

(60) Provisional application No. 63/139,013, filed on Jan. 19, 2021.

(51) Int. Cl.
*H05K 7/20* (2006.01)

(52) U.S. Cl.
CPC ..... *H05K 7/20609* (2013.01); *H05K 7/20572* (2013.01); *H05K 7/207* (2013.01)

(58) Field of Classification Search
CPC ........... H05K 7/20609; H05K 7/20572; H05K 7/20781; H05K 7/20736; H05K 7/207; H05K 7/20836
See application file for complete search history.

(56) References Cited

U.S. PATENT DOCUMENTS

| | | | | |
|---|---|---|---|---|
| 9,606,588 | B2 | 3/2017 | Dean et al. | |
| 10,251,311 | B2 * | 4/2019 | Ortenzi .............. | H05K 7/20609 |
| 12,069,839 | B2 * | 8/2024 | Ortenzi .............. | H05K 7/20572 |
| 2008/0094797 | A1 | 4/2008 | Coglitore et al. | |
| 2008/0158818 | A1 | 7/2008 | Clidaras et al. | |
| 2012/0174612 | A1 * | 7/2012 | Madara ................... | F24F 3/147<br>165/104.14 |

FOREIGN PATENT DOCUMENTS

| | | | | |
|---|---|---|---|---|
| KR | 20080000025 U | * | 1/2008 | .............. F24F 13/22 |

OTHER PUBLICATIONS

Non-Final Office Action issued in U.S. Appl. No. 17/648,174, dated Jun. 6, 2023.

(Continued)

*Primary Examiner* — Lionel Nouketcha
(74) *Attorney, Agent, or Firm* — Hogan Lovells Cadwalader US LLP

(57) ABSTRACT

An equipment cooling rack device, with a cooling cabinet, having a cooled area, adapted for holding multiple different heat creating structures to be cooled; a cooling structure, coupled to the cooling cabinet, and providing a first cooling coil for a left side of the rack and a second cooling coil for a right side of the rack, and orthogonal fans. The fans and coolant are controlled according to thermographic color of the cooling cabinet.

20 Claims, 4 Drawing Sheets

(56) References Cited

OTHER PUBLICATIONS

Final Office Action issued in U.S. Appl. No. 17/648,174, dated Oct. 6, 2023.
Notice of Allowance issued in U.S. Appl. No. 17/648,174, dated Apr. 16, 2024.

* cited by examiner

COOLING SERVERS WITH VELOCITY AUGMENTATION USING PARTIAL BY-PASS AIR RECIRCULATION IN RACK PLENUM

This application is a continuation application and claims priority to U.S. patent application Ser. No. 17/648,174, filed Jan. 17, 2022, which claims priority to U.S. Provisional Application No. 63/139,013, filed Jan. 19, 2021, which are incorporated by reference herein in their entirety for all intents and purposes.

BACKGROUND OF THE INVENTION

Computing and other equipment can be housed in racks along with other computing equipment.

These racks of computer equipment can often be housed in facilities known as computer data centers which house the electronic hardware in rack based cabinets.

In 2006, data centers in the United States (U.S.) accounted for about 1.5% (about $4.5 billion) of the total electricity consumed in the U.S. This data center electricity consumption is expected to double by 2011. More than one-third of data center electricity consumption is for cooling servers, which could equate to more than about 1% of all U.S. electricity consumed by 2020. Electricity, personnel, and construction costs continue to increase and server hardware costs are decreasing, making the overall cost of cooling a large and growing part of the total cost of operating a data center.

The term "data center" (also sometime referred to as a "server farm") loosely refers to a physical location housing one or "servers." In some instances, a data center can simply comprise an unobtrusive corner in a small office. In other instances, a data center can comprise several large, warehouse-sized buildings enclosing tens of thousands of square feet and housing thousands of servers.

The term "server" generally refers to a computing device connected to a computing network and running software configured to receive requests (e.g., a request to access or to store a file, a request to provide computing resources, a request to connect to another client) from client computing devices, includes PDAs and cellular phones, also connected to the computing network. Such servers may also include specialized computing devices called network routers, data acquisition equipment, movable disc drive arrays, and other devices commonly associated with data centers.

Typical commercially-available servers have been designed for air cooling. Such servers usually comprise one or more printed circuit boards having a plurality of electrically coupled devices mounted thereto. These printed circuit boards are commonly housed in an enclosure having vents that allow external air to flow into the enclosure, as well as out of the enclosure after being routed through the enclosure for cooling purposes. In many instances, one or more fans are located within the enclosure to facilitate this airflow.

"Racks" have been used to organize several servers. For example, several servers can be mounted within a rack, and the rack can be placed within a data center. Any of various computing devices, such as, for example, network routers, hard-drive arrays, data acquisition equipment and power supplies, are commonly mounted within a rack.

Data centers housing such servers and racks of servers typically distribute air among the servers using a centralized fan (or blower). As more fully described below, air within the data center usually passes through a heat exchanger for cooling the air (e.g., an evaporator of a vapor-compression cycle refrigeration cooling system (or "vapor-cycle" refrigeration), or a chilled water coil) before entering a server. In some data centers, the heat exchanger is mounted to the rack to provide "rack-level" cooling of air before the air enters a server. In other data centers, the air is cooled before entering the data center.

In general, electronic components of higher performing servers dissipate correspondingly more power. However, power dissipation for each of the various hardware components (e.g., chips, hard drives, cards) within a server can be constrained by the power being dissipated by adjacent heating generating components, the airflow speed and airflow path through the server and the packaging of each respective component, as well as a maximum allowable operating temperature of the respective component and a temperature of the cooling air entering the server as from a data center housing the server. The temperature of an air stream entering the server from the data center, in turn, can be influenced by the power dissipation and proximity of adjacent servers, the airflow speed and the airflow path through a region surrounding the server, as well as the temperature of the air entering the data center (or, conversely, the rate at which heat is being extracted from the air within the data center).

In general, a lower air temperature in a data center allows each server component to dissipate a higher power, and thus allows each server to dissipate more power and operate at a level of hardware performance. Consequently, data centers have traditionally used sophisticated air conditioning systems (e.g., chillers, vapor-cycle refrigeration) to cool the air (e.g., to about 65° F.) within the data center for achieving a desired performance level. By some estimates, as much as one watt can be consumed to remove one watt of heat dissipated by an electronic component. Consequently, as energy costs and power dissipation continue to increase, the total cost of cooling a data center has also increased.

In general, spacing heat-dissipating components from each other (e.g., reducing heat density) makes cooling such components less difficult and hence less costly. than placing the same components placed in close relation to each other (e.g., increasing heat density). Consequently, data centers have also compensated for increased power dissipation (corresponding to increased server performance) by increasing the spacing between adjacent servers.

In addition, large-scale data centers have provided several cooling stages for cooling heat dissipating components. For example, a stream of coolant, e.g., water, can pass over an evaporator of a vapor-compression refrigeration cycle cooling system and be cooled to, for example, about 44° F. before being distributed through a data center for cooling air within the data center.

The power consumed by a chiller can be estimated using information from standards such as the ARI 550/590-98 standard. ARI550/590-98 specifies that a new centrifugal compressor, an efficient and common compressor used in high-capacity chillers, has a seasonal average Coefficient-of-Performance ("COP") from 5.00 to 6.10, depending on the cooling capacity of the chiller. This COP does not include power consumed by an evaporative cooling tower, which can be used for cooling a condenser in the refrigeration cycle cooling system and generally has a COP of 70, or better. The combined COP for a typical system is estimated to be about 4.7.

According to some estimates, some state-of-the-art data centers are capable of cooling only about 150 Watts-per-square-foot, as opposed to cooling the more than about 1,200 Watts-per-square-foot that could result from arranging servers to more fully utilize available volume (e.g., closely spacing servers and racks to more fully utilize floor-to-ceiling height and floor space) within existing data centers. Such a low cooling capacity can significantly add to the cost of building a data center.

As the air-cooling example implies, commercially available methods of cooling have not kept pace with increasing server and data-center performance needs, or the corresponding growth in heat density. As a consequence, adding new servers to existing data centers has become difficult and complex given the effort expended to facilitate additional power dissipation, such as by increasing an existing data center's air conditioning capacity.

Various alternative approaches for cooling data centers and their servers, e.g., using liquid cooling systems, have met with limited success. For example, attempts to displace heat from a microprocessor (or other heat-generating semiconductor-fabricated electronic device component, collectively referred to herein as a "chip") for remotely cooling the chip have been expensive and cumbersome. In these systems, a heat exchanger or other cooling device, has been placed in physical contact (or close physical relation using a thermal-interface material) with the package containing the chip. These liquid-cooled heat exchangers have typically defined internal flow channels for circulating a liquid internally of a heat exchanger body. However, component locations within servers can vary from server to server. Accordingly, these liquid-cooling systems have been designed for particular component layouts and have been unable to achieve large-enough economies of scale to become commercially viable.

Research indicates that with state-of-the-art cooling, PUEs (as defined herein) of 1.4 might be attainable. However, saving electricity requires expensive equipment.

Immersion cooling of electronic components has been attempted in high-performance (e.g., computer gaming) applications, but has not enjoyed widespread commercial success. Previous attempts at immersion cooling has submerged some, and in some instances all, components mounted to a printed circuit board in a dielectric fluid using a hermetically sealed enclosure to contain the fluid. Such systems have been expensive, and offered by a limited number of suppliers. Large scale data centers generally prefer to use "commoditized" servers and tend to not rely on technologies with a limited number of suppliers.

Control systems have been used to increase cooling rates for a plurality of computers in response to increased computational demand. Even so, such control systems have controlled cooling systems that dissipate heat into the data center building interior air (which in turns needs to be cooled by air conditioning), or directly use refrigeration as a primary mode of heat dissipation. Refrigeration as a primary mode of cooling, directly or indirectly, requires significant amounts of energy.

Two-phase cooling systems have been attempted, but due to technical complexity, they have not resulted in cost-effective products or sufficiently low operating costs to justify investing in two-phase-cooling capital. Still other single- and two-phase cooling systems bring the coolant medium to an exterior of the computer, but reject heat to a cooling medium (e.g., air) external to the computer and within the data center (e.g., within a server room). Accordingly, each method of server or computer cooling currently employed or previously attempted have been prohibitively expensive and/or insufficient to meet increasing cooling demands of computing devices.

Indirectly, many researchers have tried to reduce the power of individual components such as the power supply and CPU. Although chips capable of delivering desirable performance levels while operating at a lower relative power have been offered by chip manufacturers, such chips have, to date, been expensive. Consequently, cooling approaches to date have resulted in one or more of a high level of electricity consumption, a large capital investment and an increase in hardware expense.

SUMMARY

The inventors recognize the need for an effective, efficient and low-cost cooling alternative for cooling electronic components, such as, for example, rack-mounted servers.

Embodiments as described herein define novel apparatus, systems, and methods for efficiently cooling computing devices having heat-generating electronic components, such as, for example, independently operable servers in a closed loop cooling environment, by providing adaptive cooling that carries out cooling as needed for a specific environment.

An embodiment uses two orthogonally placed fans, along with an inlet coil for cooling and an outlet coil for cooling. The fans, and the cooling amount are controlled according to a computer technique described herein. In addition, in an embodiment, the rack can include openable dampers to allow cooling using ambient air instead of the cooled air.

BRIEF DESCRIPTION OF THE DRAWINGS

The drawings show aspects of the invention as described herein.

DETAILED DESCRIPTION

Figure 1:
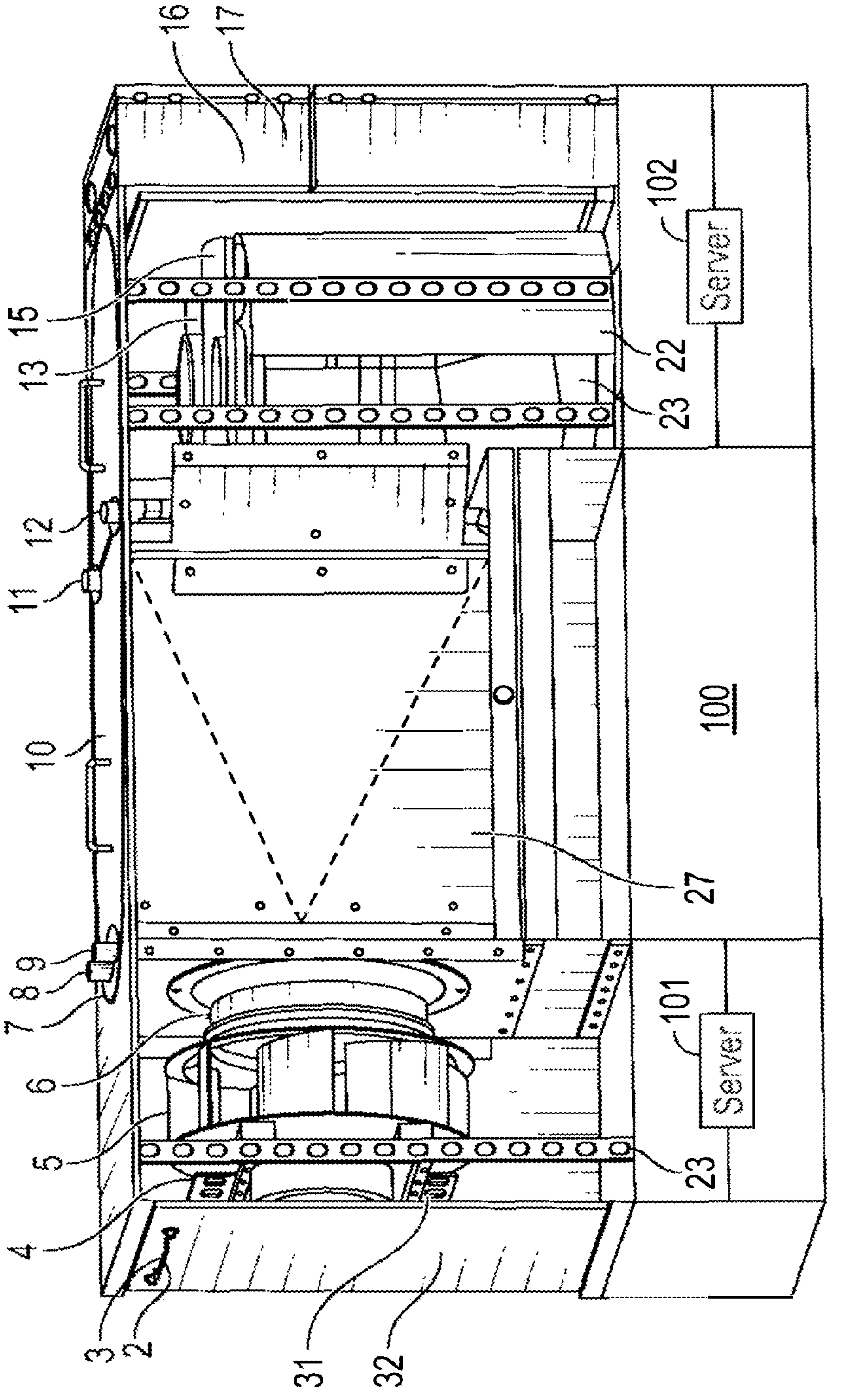
FIG. 1 illustrates top rack Left side cooling in an exploited cross section perspective view.

The present invention comprises a rack mount enclosure cabinet with multiple integrated coils designed for liquid cooling heat transfer, in conjunction with a smart logic cooling system. The control operation is based on a multi-staged multiple VFD "Variable Frequency Drive" motor that works in conjunction with coolant values at the top of the rack, established based on water temperature supply and return side cooling. In an embodiment, the control also uses a Dynamic Density Control "DDC" design, described herein, running on the United Technology Corporation "UTC" controller "I/O Pro 812u" and in conjunction with a UTC OptiCORE LS-CPU. This structure has the ability to work in conjunction with the rack level controls and mechanical infrastructure at a one to many operation.

The system includes a rack with two independent coils, including an inlet coil and an outlet coil. The coils are independent from the electronic equipment. The coolant inlet and the coolant outlet are fluidly separated from each other and maintained by a return smart valve and software AI techniques as described herein, to provide cooling air for a plurality of independently operable servers. An embodiment uses a liquid coolant; a heat exchanger fluidly coupled to the coolant outlet; a pump fluidly coupled to the heat exchanger; Chiller and extinguishing heat outside of the building, a pump being configured for pumping the liquid coolant through a fluid circuit, a controller for monitoring the temperature of the liquid coolant in multiple location within the rack environment and for adjusting the flow on both supply and return side of the rack.

In one embodiment, the cooler uses a cold side channel or duct, allowing air to be dispersed at the bottom of the rack, with an air flow adjustment by-pass throughout channel interior keeping bottom to top temperatures within a 1 degree F. Exterior sensors that maintain the cooling that has been determined but will also maintain safety and data center standards, not allowing racks to overheat or ever rise above dew point. Liquid coolant through hybrid water to air solution, in order that the liquid coolant is maintained at an elevated required temperature based on efficiencies achieved as it exits the return side allowing the differential split that required. This allows sufficiently cooling each respective server while maintaining the exiting heated liquid coolant at the elevated temperature at return to reduce the amount of energy consumed to sufficiently cool each of the plurality of servers. The system uses comprehensive logic controls as described herein, to maintain all aspects of cooling and pressurized systems within the environment depending on server standards that are being achieved. This includes supply and return dampers that work in conjunction with automated valves that control the flow rate of water flow rate. All factors including fan speed; airflow of the fans, e.g., CFM both on the supply and return fan giving the ability to support positive and negative air within the plenums of both supply and return are controlled by the controller. This can also be controlled on both the top and bottom of the rack, by giving by-pass ability with automated dampers that are used in conjunction with fans. The controls manage pumps and chiller infrastructure, in cold or hot exterior conditions, maintaining the highest possible efficiencies desired to cool the infrastructure; and to minimize rack condensation.

Figure 2:
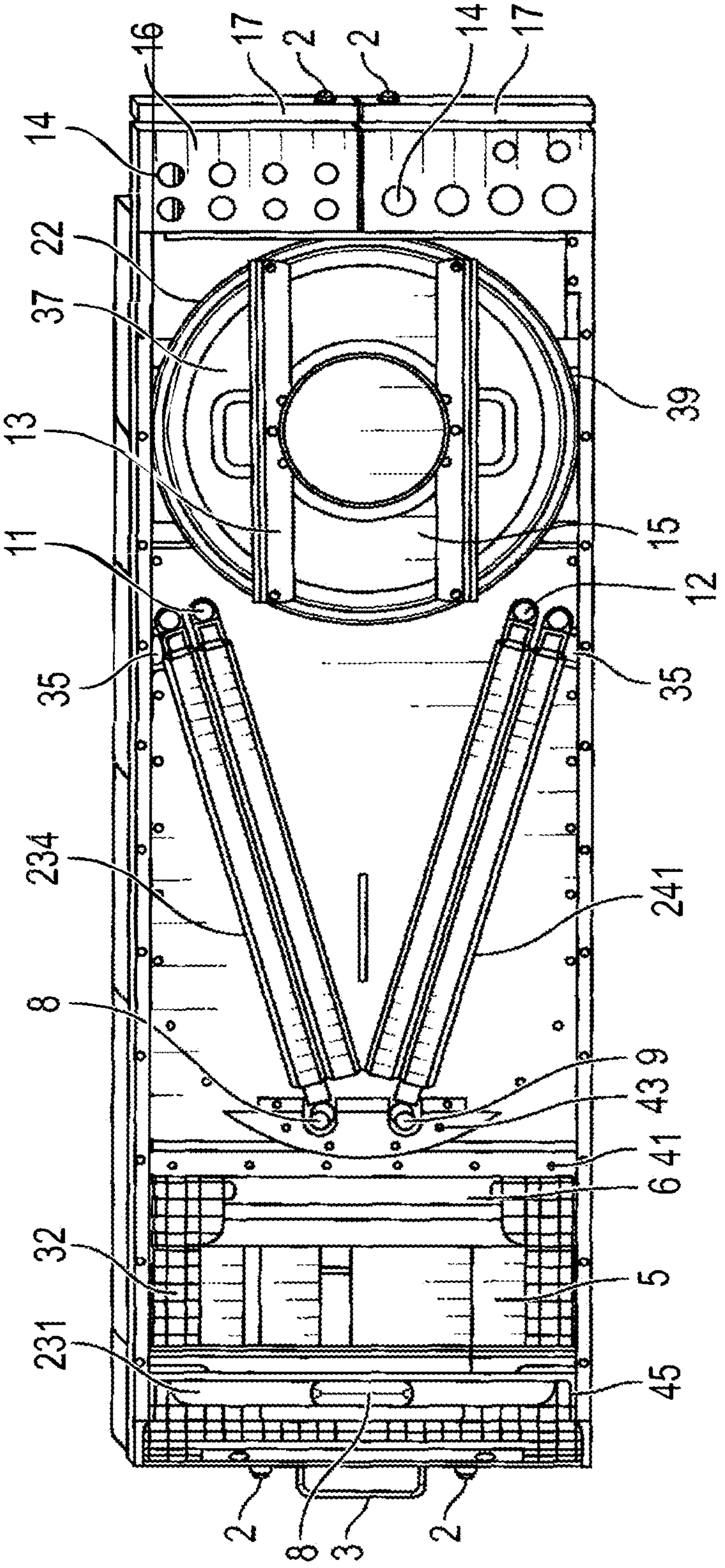
FIG. 2 illustrates the top rack exploited top section perspective view.
Figure 3:
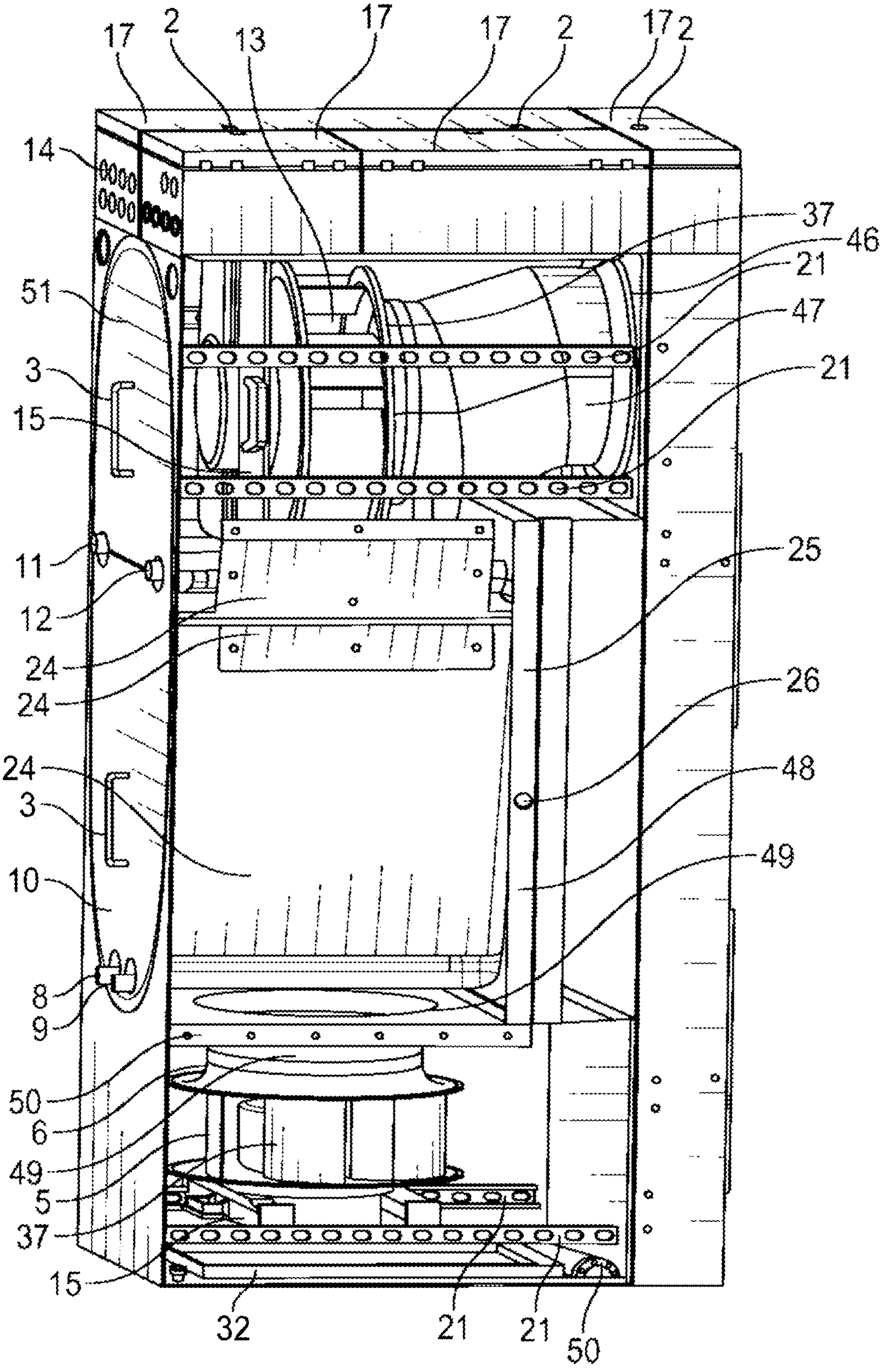
FIG. 3 illustrates top rack exploited with internal and top view in a exploited vertical side section perspective view.

The structure which carries out this operation is shown in the figures. FIGS. 1-3 show a basic structure of the overall rack. The rack is formed with openable panels or maintenance hatches, such as 32 shown in FIG. 1. The maintenance hatches 32 are held on by compression locks 2, also equipped with handles 3. Once inside, there are additional handles 4 that support fan maintenance. In an embodiment, the supply side fan 5 can be a 500 mm fan using a variable frequency drive at 8900 CFM. The fan 5 provides airflow through a cowling 6 to the primary cold side of the rack, forming the push side of the cooling.

The cowling 6 pushes air into the rack interior 100. The top of the rack is sealed with a sealing gasket fitting 7 and cover, maintaining the pressure inside the rack interior area 100. The interior area 100 is cooled by the cold air pushed into the interior. The interior area includes multiple different heat creating structures to be cooled e.g, servers 101, 102.

Each side of the rack has its own cold water supply, with the piping 8 representing the cold water supply for the right side of the rack and piping 9 representing the cold water supply for the left side of the rack. The maintenance hatch 10 covers the top of the rack maintaining the essential pressure requirements. In a similar way, there are return pipes, with pipe 11 representing the return water supply for the right side of the rack and pipe 12 representing the return water supply for the left side of the rack.

There is also a return fan 13, on the right side of the rack, forming the pull side of the cooling system.

The fan 13 is mounted in a fan bracket 15. As can be seen from the figures, the fan 5 on the right side faces to the center of the rack, and the fan 13 on the right side faces orthogonal to the first fan 5.

The right side of the rack also forms a power management raceway 16, which has a hinged door 17.

The return fan 15 has a curved cowling 22 allowing the velocity airflow across the air assembly. The cowling 22 forms channel 23 that controls the airflow on the secondary side.

Microchannel coil 27 is cooled using the cooled air.

FIG. 2 shows additional details of the fan mounting, where 231 represents the removable motor mounting rails on the supply side fan 5. FIG. 2 also shows additional service hatches such as 32 providing access to the supply-side motor.

The cold water supply input for the right side of the rack, is also shown as a vertical view as items 8,9. Similarly, the vertical view of the cold water for the right side of the rack is shown as 11,12. A large microchannel coil for the left side of the rack shown as 234, is between the cold water supply 8 and the return supply 11. In a similar way, the micro coil 241 is for the right side of the rack between the supply 9, and return 12. As shown in FIG. 2, the cooling coils 234, 241 are arranged at opposite angles to one another, so that the air passes over these coils on its way to the fan 5. The cooling coil 234 is connected between the side of the rack, and the center of the rack, and the cooling coil 241 is connected between the opposite side of the rack in the center of the rack. In this way, the two cooling coils handle cooling of the 2 opposite sides of the rack.

9 represents the vertical view of the cold water supply inlet for the right side of the rack. The curved cowling 22 allows velocity airflow across the fan assembly.

FIG. 3 illustrates an alternative view of the assembly, showing the fan 5 facing from left to right, the cowling 6, exhausting the air into the area of the microchannel coolers such as 241, and the exhausted air being drawn up by the fan 13.

Figure 4:
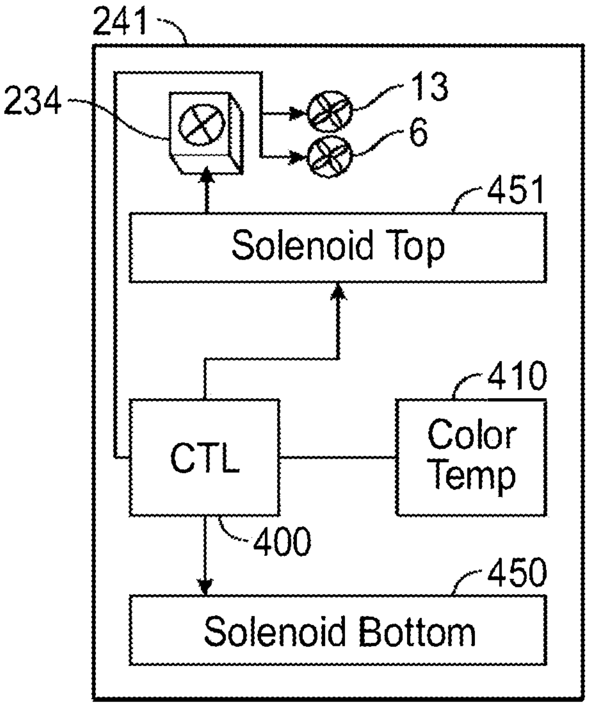
FIG. 4 shows the control block diagram, with the openable top and bottom bypass parts.

FIG. 4 shows a block diagram of the rack. A controller 400 is programmed according to the techniques described herein to control different aspects of the cooling. The controller receives information indicative of a color temperature, that is thermographically indicative of a temperature of the cool area, from a color temperature acquiring device 410. This color temperature acquiring device can be a thermal camera or thermographic camera, or some other analogous heat determining image device. In another embodiment, the color temperature acquiring device 410 can comprise heat sensors that obtain temperature and model the color temperature of all of the rack, or different areas of the rack.

Based on the inputs, the controller controls the fans including the fan 5 and the fan 13 at the top of the rack. A solenoid 415 controls an amount of cooling water supplied to the coolers 234 241.

The controller also controls using bypass air. A first bypass air control is a top solenoid device, 451 at the top of the rack dampener allowing bypass air as needed, based on the front and back fan pressure control techniques as described herein. There is also a bottom solenoid device 450 that opens the rack to ambient air from the bottom. These bypasses can open to admit outside air, using the techniques described herein.

In operation, the system operates as follows. All of these techniques can be controlled by programming the controller in an appropriate way as described herein, and flowcharted in FIG. 5.

The static temperature value, by itself, is believed by the inventors to be a common and imprecise measure used in control strategy. The DDC Cabinet Technology of an embodiment uses temperature value as a reference, with that temperature value being manipulated in a new way.

The DDC Logical control determines a cabinet thermographic color using the color temperature obtaining device 410. The color temperature obtaining device can be for example a thermal camera, or other thermal imaging equipment. It can alternatively be a modeling device which determines local temperatures of different areas in the cabinet, and uses these to create a thermal color representing the cabinets current color temperature.

The controller compares the cabinet color temperature to the cabinet's set point for temperature control to determine whether additional or less cooling can be used. The color temperature at the end of a cooling period is determined. This color temperature, or simply "color", is then used to modify the set point to form an effective set point that is different than the actual setpoint as described herein. This can use logical programming, such as If Color=logic.

When examining a thermograph, blue represents cold. Green is approximately room temperature. Shades of red and white display areas of inflammation. In a thermal image, darker colors represent hotter areas. Accordingly, the purples and dark blue/black indicate cooler temperatures (because they emit less heat and infrared radiation).

The cabinet's effective set points may differ from its programmed set points, based on the cabinet color and measured thresholds.

A combination of electric demand levels and thermal safety adjustment thresholds are determined based on multiple measurements of temperature which are done over time. This forms an array of ratios that predict an exact curve within a linear approximation of a cooling function that approximates the programmed set point using the effective set points. The effective set points are set using the programmed set points as adjusted using the linear approximation and the color. All such adjustments to the programmed set points are cumulative.

Figure 5:
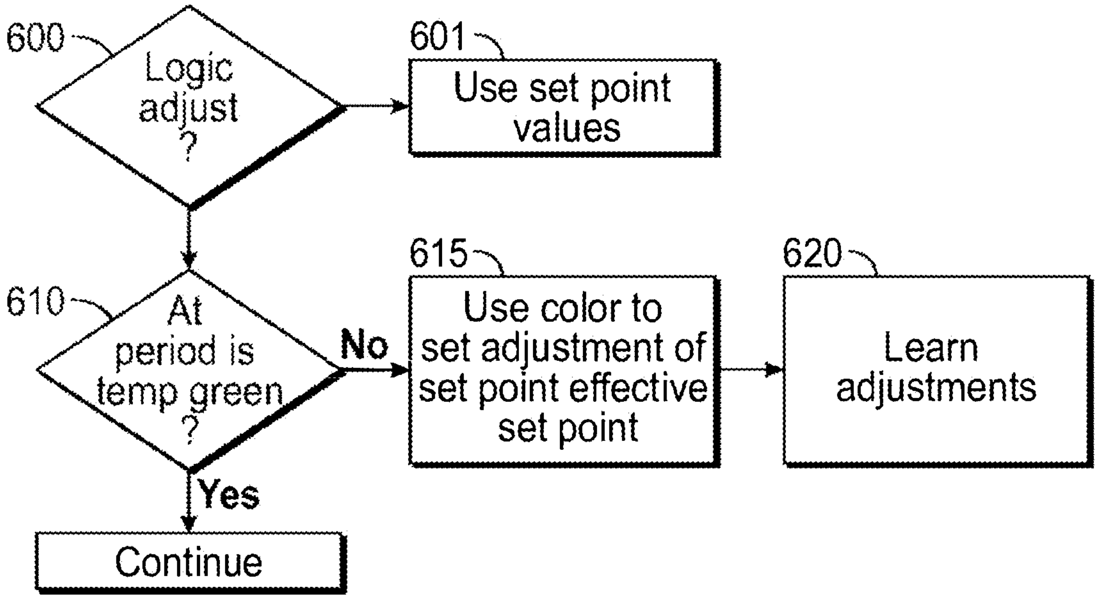
FIG. 5 shows a flowchart of operations to carry out temperature maintenance.

The operation is shown in the flowchart of FIG. 5. At 600, a first operation determines whether logic adjustment is on. Logic adjustment may be turned off during testing, cleaning or other operations. To prevent learned capacities from being distorted during override and maintenance periods, this learning inhibit prevents learned capacities from being adjusted during override and maintenance or during high rack loading periods.

When the logic adjustment is off, the system simply uses the existing set point values at 601 to control the cooling. When an interpretability interpretation equals true (on), the logic adjusts the cooling "programmed" set point values to generate the effective set point value.

To minimize the energy required during operation, when the interpretability interpretation equals true, the DDC AIA evaluates the Cabinet thermographic color and adjusts the learned heating or cooling capacity for the next change in temperature value or energy period threshold. If the cabinet temperature does not reach the set point by the next change in temperature value period at 610, detected by the cabinet thermographic color not being green, indicating room temperature during that period, control passes to 615 where the thermographic color is used to select an adjustment value to adjust the set point. The adjustment value self adjusts using learned information at 620 to create new adjustment values for subsequent cycles.

If the cabinet is undercooled during a cycle, this will be detected by the cabinet not being green (or blue). When this is detected, then an adjustment value is adjusted to form more aggressive cooling. The aggressiveness of the cooling can be the amount of time that the cooling cycle runs, can include the amount of coolant added into the pipes, and can include the speed of the cooling fans. The adjustment value in one embodiment can be pre-defined for the cabinet's thermographic color upon the initial load design, and adjusted based on subsequent operations.

In one embodiment, the adjustment value causes more aggressive cooling by cooling for a longer cycle. Then, during the next temperature value period, the predicted curve begins sooner because the learned capacity has been reduced, and hence is lower. If the cabinet temperature value reaches the effective set point at any time during the thermal period, the DDC AIA increases the learned heating or cooling capacity by the applicable green adjustment value regardless of the cabinet's color at satisfaction. During the next temperature value or energy period threshold, the DDC AIA begins later because the capacity is higher.

Temperature Value Example: A cabinet's heating capacity is 5° per hour. Its light blue learning adaptive adjustment value is 0.06. If at energy period threshold, the cabinet's thermographic color is light blue, the DDC AIA uses a learned heating capacity of 4.94° (5°-0.06°) per hour in its DDC AIA calculations for the next period. The goal is to get the cabinet to green during a cycle. There are different adjustment values for green, white red, and other thermographic colors. As described above, these adjustment values can be pre-defined for the thermal load, and changed based on the actual cooling results.

By using the learned capacities in its calculations, the Logical code with Adaptive Learning and DDC AIA calculates times more accurately and controls equipment more efficiently than other logic. Learned capacities can be displayed and/or can be used by other parts of the control program.

In one embodiment, the bypass dampers 451 and/or 552 can be opened to allow using the outside air exchange for free cooling, rather than using cooled air. The design temperature values and capacities set in the DDC AIA estimate the time needed to warm or cool the cabinet from the energy period threshold set points to the thermal set points. When the estimated time is less than the remaining thermal time, the DDC AIA outputs the programmed predicted set point values. When the estimated time to reach the thermal set points equals the remaining energy period threshold time, the DDC AIA transitions the effective set points to the DDC AIA set points using the first-order curve that approximates system performance at full capacity.

The DDC AIA is observed throughout the logical program, allowing all facets of control to be observed in several uniform algorithms working together also known as quadratic equations.

An embodiment uses a basic quadratic formula and its derivation of the form 〚ax〛^2+bx+c=0 where a, b and c are the quadratic coefficients and/or the constants.

In one embodiment, the "DDC" Dynamic Density Control rack controller monitors the discharge air and the return air from the equipment IT load within the self-contained rack. The controller modulates the chilled water valve as required, based on the specific logic that has been determined prior to load or IT facility standard builds, discharging air at specific set-points. This is adjusted automatically based on return air temperature versus set-points. The "DDC" Dynamic Density Control also controls the fan start/stop and speed as well as monitoring fan speed feedback based on RPM.

An embodiment programs the controller with 10 demand limit flags that allow for set-point bumps at different levels/demand, adjustable per controller from the EMS when required. At any point and time based on the thresholds that are configured, up to 100 KW Kilowatts of power at peak sustained loads can be provided. The "DCIM" Data Center Infrastructure Manager works in correlation with the facilities cooling systems. This allows all chilled water distribution that feeds from the facilities chillers to the racks that maximizes efficiencies in multiple factors. This includes the ability to control the chiller frequency for minimum or maximum cooling required at any point and time in conjunction with the chiller pumps. This supplies the correct amount of PSI/GPM to cool the rack load at any given time. All data adjustments are made every second based on IT or power load, with the ability to use many different cooling levels required in a N/N+1/2/2N configuration, or some other period.

The DDC "Dynamic Density Control" modulates all rotation of values in all automated aspects from chiller rotation, pump rotation, and by-pass required flow based on GPM/PSI and low rates that have been pre-determined.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

For example, other sizes of plenums and fans can be used.

The self-contained rack design is based on a Nema-3 enclosure that circulates the airflow in a forced air manor from front to back the top of the unit based on cooling and heating dynamics. The rack design is based on an 18 in. plenum in front of the intake side of the IT/Server hardware and exhausted through the back of the servers on the return side of the rack, which also supports an 18" plenum.

The size of the plenum is based on airflow requirements that are needed to support 100 Kw @ 8,700 CFM on a push pull design, without restriction preventing back-flow concerns. The dual coil design is deployed at the top of rack, allowing the forced air side of the rack to use cooling from the top of the rack based on the fact that cold air drops, using less energy. The rack is able to maintain a delta of 1 to 2 degrees from the top of the rack to the bottom of the rack, allowing constant temperature throughout the supply side of the server rack. Positive air pressure will be maintained based on server requirements, maintaining constant pressure, as needed on a positive or negative front to back requirement.

In an embodiment, all control wiring is concealed using tamper proof raceways between wall mounted electronics and mechanical hardware that have also been isolated from each device by separate compartments. This allows the isolation of low voltage and high voltage in the same containment area. All controls are located on outside of the rack contained in multiple nema 3 enclosures, maintaining ambient cooling and the ability to preserve gear without entering the rack enclosure.

Cabinet to cabinet cable management has been designed in a couple different fashions giving the ability for cabinet to cabinet with 4"×4" gutter with secure and removable face plates, concealing and maintaining integrity between racks. This is installed between cabinet sections using laser knockouts for pass-through with associated brush material preventing blow-by in between racks. For multiple rack cable management, a different design has been created using a 4"×6" inter-cabinet with a larger 12" gutter that interlocks at the top of rack with the ability to extend in either direction allowing any rack deployment configuration. All electronics have been isolated and built with the ability for quick disconnect and easy replacement. Air filtration has been installed keeping any contaminants that might have entered the rack during any IT maintenance that might have occurred during that time, continuing to keep rack a clean environment. Fire suppression has also been installed that supports temperature release activation at 220 degrees with shunt trip capability or none-trip based on the customer requirements. The top of rack box enclosure has been developed to support this design and isolates the power from the low voltage infrastructure.

In one or more exemplary embodiments, the functions described may be implemented in hardware, software, firmware, or any combination thereof. If implemented in software, the functions may be stored on or transmitted over as one or more instructions or code on a computer-readable medium. Functions can also be carried out by programmed computer readable media which can be an article comprising a machine-readable non-transitory tangible medium embodying information indicative of instructions that when performed by one or more machines result in computer implemented operations comprising the actions described throughout this specification.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An equipment cooling rack device, comprising:

a cooling cabinet having an internal area configured to receive one or more heat creating structures;

one or more cooling coils;

a first fan, located on a first side of the cooling cabinet and upstream of the one or more cooling coils, the first fan configured to direct air across the one or more cooling coils from the internal area, wherein the first fan is arranged with a first outlet direction;

a second fan, located on a second side of the cooling cabinet opposite the first side, the second fan configured to direct the air into the internal area, wherein the second fan is arranged with a second outlet direction orthogonal to the first outlet direction;

one or more heat sensors configured to obtain temperature information associated with at least a portion of the cooling rack device; and a controller configured to regulate operation of each of the first fan and the second fan based, at least in part, on the temperature information.

2. The equipment cooling rack device of claim 1, further comprising:

a first inlet associated with the one or more cooling coils configured to direct a fluid from a cold fluid supply through the one or more cooling coils; and a first outlet associated with the one or more cooling coils configured to direct the fluid to a heated fluid return.

3. The equipment cooling rack device of claim 1, wherein the one or more cooling coils comprise at least two cooling coils, and a first cooling coil of the at least two cooling coils is arranged at an angle with respect to a second cooling coil of the at least two cooling coils.

4. The equipment cooling rack device of claim 3, wherein the angle is an acute angle.

5. The equipment cooling rack device of claim 1, wherein the first fan and the second fan are positioned axially higher than the internal area.

6. The equipment cooling rack device of claim 1, further comprising:

a first plenum associated with the first fan; and a second plenum associated with the second fan.

7. The equipment cooling rack device of claim 6, wherein the controller is further configured to control a first pressure within the first plenum and a second pressure within the second plenum based, at least in part, on an airflow within the cooling cabinet, wherein the first pressure or the second pressure may be a positive pressure or a negative pressure.

8. The equipment cooling rack device of claim 1, wherein the controller is further configured to control an amount of fluid provided to the one or more cooling coils.

9. The equipment cooling rack device of claim 1, wherein at least a portion of the cooling cabinet corresponds to a Nema-3 enclosure.

10. A system, comprising:

an enclosure configured to hold one or more heat creating structures;

a cooling cabinet coupled to and positioned axially above the enclosure, the cooling cabinet comprising:

one or more cooling coils;

a first fan located at a first side of the cooling cabinet, the first fan configured to direct air into the enclosure via a first plenum; and a second fan located at a second side of the cooling cabinet, opposite the first side and separated, at least in part, by the one or more cooling coils, the second fan configured to receive the air from the enclosure via a second plenum; and a controller configured to control operation of each of the first fan and the second fan based, at least in part, on at least one of temperature information associated with the enclosure collected by one or more heat sensors, a liquid coolant flow rate, or a load.

11. The system of claim 10, wherein the first fan is arranged orthogonal to the second fan.

12. The system of claim 10, wherein the first fan and the second fan are arranged in a forced air cooling configuration such that the air received from the enclosure is driven across the one or more cooling coils before the air is directed back into the enclosure.

13. The system of claim 10, wherein the one or more cooling coils are coupled to at least one supply line and at least one return line, wherein the at least one supply line provides cooling fluid to the one or more cooling coils and the at least one return line directs heated fluid away from the one or more cooling coils.

14. The system of claim 13, wherein the controller is further configured to control at least one of a first rate of cooling fluid provided via the at least one supply line or a second rate of heated fluid exiting the cooling coil via the at least one return line.

15. The system of claim 10, wherein the one or more cooling coils comprise at least two cooling coils, and a first cooling coil of the at least two cooling coils is positioned at a right side of the cooling cabinet and a second cooling coil of the at least two cooling coils is positioned at a left side of the cooling cabinet.

16. A cooling cabinet for a cabinet enclosure, comprising:

one or more cooling coils;

a first fan, located on a first side of the cooling cabinet in a downstream direction of air flow through the cooling cabinet with respect to the one or more cooling coils, wherein the first fan is arranged with a first outlet direction; and a second fan, located on a second side of the cooling cabinet opposite the first side, in an upstream direction of air flow through the cooling cabinet with respect to the one or more cooling coils, wherein the second fan is arranged with a second outlet direction orthogonal to the first outlet direction;

wherein a controller is configured to regulate operation of each of the first fan and the second fan based, at least in part, on temperature information associated with the cabinet enclosure, a liquid coolant flow rate associated with the one or more cooling coils, or a load associated with the cabinet enclosure.

17. The cooling cabinet of claim 16, wherein the one or more cooling coils are coupled to at least one supply line and at least one return line, wherein the at least one supply line provides cooling fluid to the one or more cooling coils and the at least one return line directs heated fluid away from the one or more cooling coils.

18. The cooling cabinet of claim 17, wherein the controller is further configured to control at least one of an inlet rate of cooling fluid to the one or more cooling coils or an outlet rate of heated fluid from the one or more cooling coils.

19. The cooling cabinet of claim 16, wherein the one or more cooling coils comprise two cooling coils and a first cooling coil of the two cooling coils is positioned at an angle relative to a second cooling coil of the two cooling coils.

20. The cooling cabinet of claim 16, wherein at least a portion of the cooling cabinet corresponds to a Nema-3 enclosure.

* * * * *